United States Patent [19]

Hsu

[11] Patent Number: 5,744,392
[45] Date of Patent: Apr. 28, 1998

[54] PROCESS FOR FABRICATING A MULTI-STAGE READ-ONLY MEMORY DEVICE

[75] Inventor: Chen-Chung Hsu, Taichung, Taiwan

[73] Assignee: United Microelectronics Corporation, Taiwan

[21] Appl. No.: 612,823

[22] Filed: Mar. 11, 1996

[51] Int. Cl.[6] .................................................. H01L 21/8246
[52] U.S. Cl. .......................... 438/275; 438/276; 438/277
[58] Field of Search ................................. 438/275–280, 438/217; 257/910

[56] References Cited

U.S. PATENT DOCUMENTS

| | | | |
|---|---|---|---|
| 5,550,075 | 8/1996 | Hsu et al. | 438/275 |
| 5,571,739 | 11/1996 | Hong | 438/275 |
| 5,585,297 | 12/1996 | Sheng et al. | 438/278 |

*Primary Examiner*—Jey Tsai
*Attorney, Agent, or Firm*—Rabin, Champagne & Lynt, P.C.

[57] ABSTRACT

A multi-stage ROM device capable of storing multi-stage data and allowing high packing density for a ROM chip thus fabricated and a process for fabricating such a multi-stage ROM device. In the ROM device, the intersection between a first bit line and a word line is formed with a diode having a threshold voltage controlled at about 0.7 V, and the intersection between another bit line and word line is formed with a bipolar transistor with a threshold voltage controlled at about 3 V–5 V. The other intersections are each formed with a permanently-OFF transistor. By using these different types of memory cells, the ROM device is capable of storing multi-stage data.

8 Claims, 3 Drawing Sheets

1

PROCESS FOR FABRICATING A MULTI-STAGE READ-ONLY MEMORY DEVICE

BACKGROUND OF THE INVENTION

1. Field of the Invention

The invention relates to semiconductor memory devices, and more particularly, to a read-only memory (ROM) device capable of storing multi-stage data and a process for fabricating such a ROM device. Characteristically, the ROM device has intersections between the bit lines and the word lines formed with at least three kinds of memory cells: diodes, bipolar transistors, and permanently-OFF transistors, so that the ROM device is capable of storing multi-stage data and allows a high packing density for the ROM chip thus fabricated.

2. Description of Prior Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system in personal computers) or the like. The manufacture of the ROM involves very complicated and time-consuming processes and requires costly equipment and material to achieve. Therefore, the information to be stored in the ROM is usually first defined by the customer and then furnished to the factory to be programmed into the ROMs.

Most ROMs are identical in semiconductor structure except the data stored therein. Therefore, the ROM devices can be fabricated up to the stage ready for the programming and then the semi-finished products are stocked in an inventory room waiting for customer orders. The customer then furnishes the data to the factory and the factory programs the data into the semi-finished ROMs by using predefined masks. Such a procedure is now a standard method in the semiconductor industry for fabricating ROMs.

In most ROMs, field effect transistors (FETs) are used as the memory cell. In the programming stage, impurities are selectively implanted into specific channels in the FET so as to change the threshold voltage thereof, thereby allowing their ON/OFF control. Referring to FIG. 1, there is shown a schematic top view of the layout of a single cell in a conventional semiconductor memory device. In the memory device, polysilicon-based word lines WL cross over bit lines BL. The channel 100 is located beneath the word lines WL and substantially between two adjacent bit lines BL. Binary data of values "0" and "1" is stored in the channel according to whether the channel is implanted with impurities.

FIG. 2 shows a schematic sectional view of a conventional FET-based ROM device. In the fabrication process, a silicon substrate 10 is implanted with N-type impurities, such as arsenic ions, so as to form a plurality of equally spaced buried bit lines 11. The interval between two adjacent bit lines forms a channel. An oxidation process is then performed to form an oxide layer having a first thickness portion 12a covering the bit line 11 and a second thickness portion 12b above the channel formed between adjacent bit lines 11. The first thickness portion 12a is thicker than the second thickness portion 12b. Next, a polysilicon layer 13 is deposited and a lithographic process is used to define a pattern of crosswise bit lines on the polysilicon layer 13. A mask 14 is then formed to expose only the channel 15 that is to be programmed with binary data. P-type impurities such as arsenic ions are then implanted into the channel 15 and the programming step is completed.

It is a drawback of the foregoing ROM device that the use of FETs as the only data storing means requires a large space and causes the memory cell to be large in size, thus resulting in a low packing density of the ROM chip.

SUMMARY OF THE INVENTION

It is therefore a primary object of the invention to provide a multi-stage ROM device which allows the packing density of the thus fabricated ROM chip to be high so as to accommodate more memory cells.

In accordance with the foregoing and other objects of the invention, there is provided a new and improved multi-stage ROM device and a process for fabricating the ROM device.

In a first embodiment of the invention, the ROM device has the intersection between a specific bit line and a word line formed with a bipolar transistor with a threshold voltage controlled at about 3 V–5 V, and the intersection between another bit line and word line formed with a diode with a threshold voltage controlled at about 0.7 V. The other intersections are each formed with permanently-OFF transistors.

In a second embodiment of the invention, the ROM device has multi-stage data storing capability due to different electric characteristics between the diode and the bipolar transistor.

In a third embodiment of the invention, the ROM device utilizes the current difference between the diode and the bipolar transistor when the two are conductive so as to facilitate the data sensing by sensing amplifiers.

The ROM device according to the invention includes a silicon substrate; a plurality of buried bit lines of a first type provided in parallel and at predetermined intervals on the silicon substrate; a thin oxide layer formed between adjacent pairs of the plurality of buried bit lines on the silicon substrate; a thick oxide layer formed on each of the plurality of buried bit lines and having a thickness greater than that of the thin oxide layer; and a plurality of word lines formed on the thin oxide layer and the thick oxide layer and arranged crosswise to the plurality of buried bit lines. In the ROM device word lines and buried bit lines cross each other at intersections at which a plurality of diode memory cells, a plurality of bipolar transistor memory cells, and a plurality of permanently-OFF transistor memory cells are formed.

The process according to the invention for fabricating the foregoing ROM device includes the steps of: preparing a silicon substrate; forming a plurality of parallel arranged buried bit lines of a first type including at least a first bit line, a second bit line, and a third bit line; forming an oxide layer on the silicon substrate, the oxide layer having a first thickness over the plurality of buried bit lines and a second thickness over the intervals between each adjacent pair of the plurality of buried bit lines, the first thickness being greater than the second thickness due to the semiconductor material characteristics; forming first openings through the oxide layer on the first bit line so as to expose the first bit line, and second openings through the oxide layer on the second bit line so as to expose the second bit line; performing a first ion implantation process through the first openings on the first bit line so as to form ion regions of a second type in the first bit line; performing a second ion implantation process through the second openings on the second bit line so as to form base regions of the second type in first collector regions of the second bit line and then performing a third ion implantation process through the second openings so as to form first type emitter regions on the second bit line, thus creating bipolar transistors. Next, a step of forming a plurality of parallel arranged word lines is carried out, in which each of the word lines crosses the plurality of bit lines to form a plurality of intersections, each of the plurality of word lines covering both a corresponding one of the first openings through the oxide layer on the first bit line and a corresponding one of the second openings through the oxide layer on the second bit line, thus creating diode memory cells at the junction between the first bit line and the thick oxide layer covering the first bit line, bipolar transistor memory cells at the junction between the second bit line and the thick oxide layer covering the second bit line, and permanently-OFF transistor memory cells at the junction between the third bit line and the rest of the thick oxide layer.

BRIEF DESCRIPTION OF DRAWINGS

These and other objects, features and characteristics of the invention, as well as methods of operation and economies of manufacture, can be more fully understood by reading the subsequent detailed description of the preferred embodiments thereof with references made to the accompanying drawings, all of which form a part of this specification. In the drawings.

DETAILED DESCRIPTION OF THE PREFERRED EMBODIMENT

Figure 1:
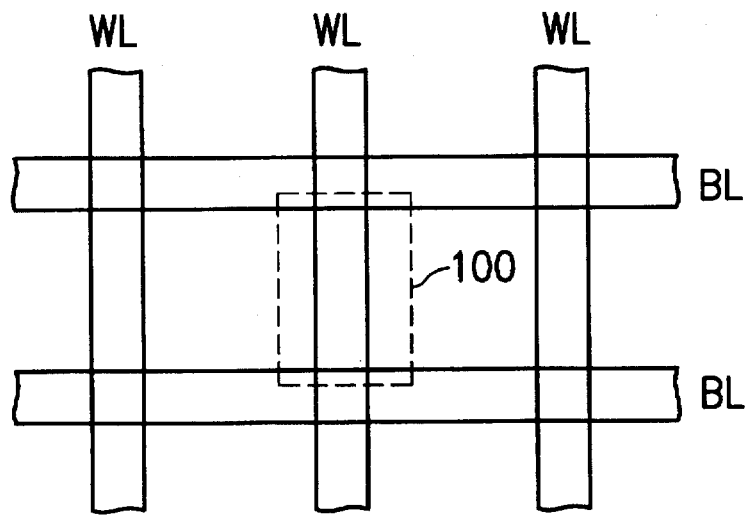
FIG. 1 is a schematic top view showing the layout of a single cell in a conventional semiconductor memory device.
Figure 2:
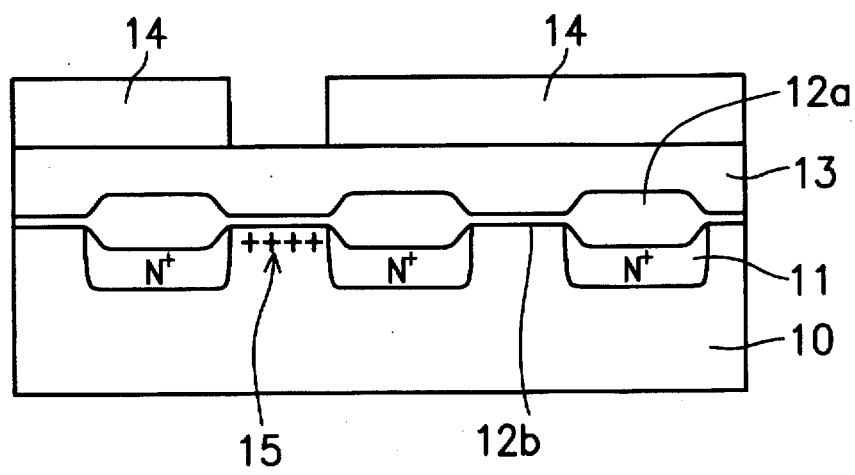
FIG. 2 is a schematic sectional diagram showing a conventional FET-based ROM device.
Figure 3A:
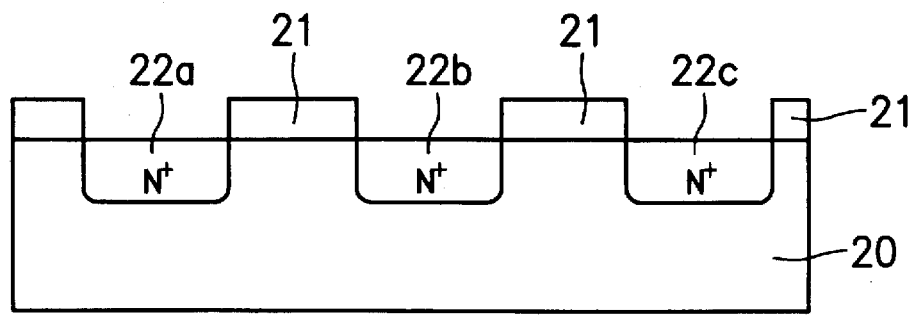
FIGS. 3A–3F are schematic sectional diagrams used to depict the steps involved in a process in accordance with the invention for fabricating a multi-stage ROM device.

Referring to FIG. 3A, there is shown a sectional diagram depicting the process of fabricating bit lines in the ROM device according to the invention. A silicon substrate 20 is prepared and a photoresist layer 21 is coated thereon. A lithographic process is then used for pattern definition on the photoresist layer 21 which then serves as a mask for ion implantation of first type impurities such as N-type arsenic ions, on the silicon substrate 20. The ion implantation allows the silicon substrate 20 to be formed with a plurality of equally spaced N⁺-type buried bit lines 22a, 22b, 22c. The implantation is performed with an energy of 50 to 100 KeV and an ion concentration of $1 \times 10^{14}$ to $1 \times 10^{16}$ atoms/cm². After that, the photoresist layer 21 is removed by using suitable solvents.

Figure 3B:
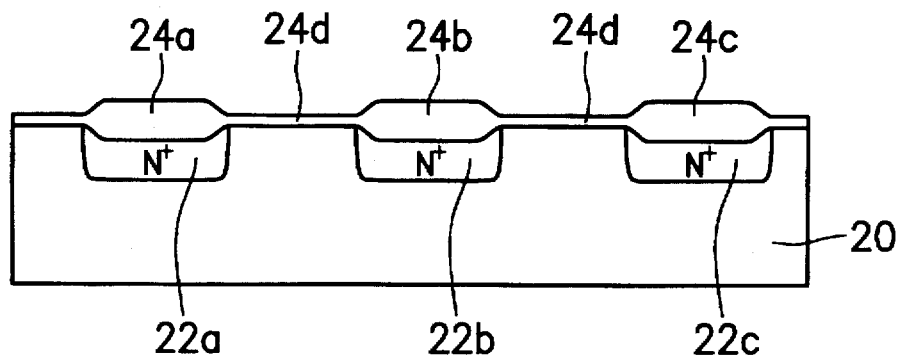

Referring to FIG. 3B, there is shown a sectional diagram depicting the process of oxide layer fabrication. The process is performed at a temperature of 850° C. to 950° C. to oxidize part of the silicon substrate 20 into an oxide layer. Since the N⁺-type bit lines 22a, 22b, 22c are doped with an N-type impurity, the oxidization there is faster than other parts of the silicon substrate 20. As a consequence, the oxide layer includes portions 24a, 24b, 24c formed on the bit lines 22a, 22b, 22c with a first thickness of 800Å to 1000Å and portions 24d formed on the intervals between adjacent pairs of the bit lines 22a, 22b, 22c with a second thickness of 250Å to 300Å.

Figure 3C:
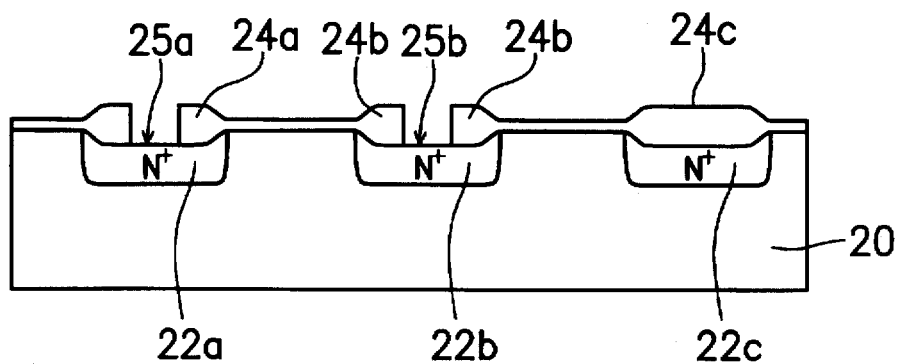

Referring to FIG. 3C, there is shown a sectional diagram depicting the process of forming openings 25a, 25b through the oxide layers 24a, 24b on the bit lines 22a, 22b. Anisotropic etching methods such as reactive ion etching (RIE) are used to form the openings 25a, 25b so as to expose the underlying bit lines 22a, 22b.

Figure 3D:
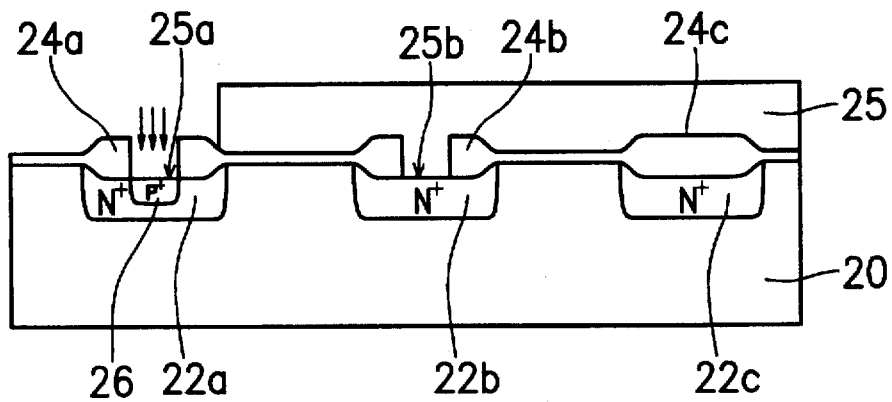
Figure 3E:
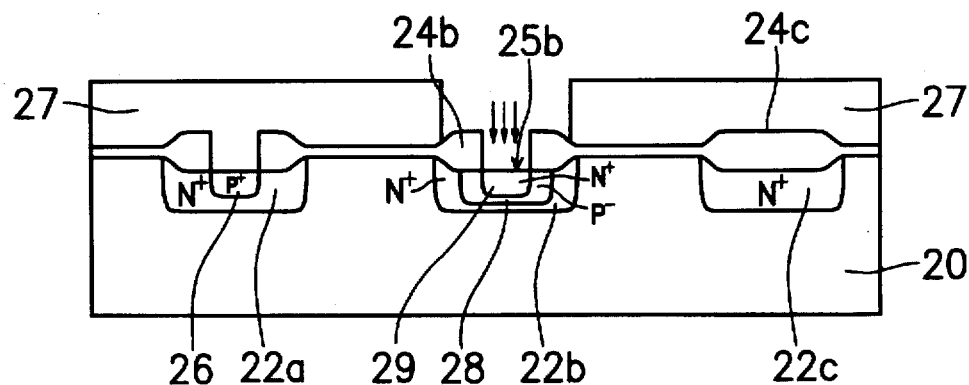

Referring to FIG. 3D and FIG. 3E, sectional diagrams are depicted illustrating the process of ion implantation through the openings 25a, 25b onto the bit lines 22a, 22b. As shown in FIG. 3D, a photoresist layer 25 is coated in such a way that every part of the oxide layer except the portion 24a and its opening 25a on the bit line 22a is covered. After that, an ion implantation process is performed to implant an impurity of a second type such as P-type boron ions through the opening 25a onto the bit line 22a so as to form a P⁺-type region 26. The implantation is performed with an energy of 30 to 70 KeV and an ion concentration of $1 \times 10^{15}$ to $1 \times 10^{16}$ atoms/cm². After that, the photoresist layer 25 is removed by using suitable solvents.

Now referring further to FIG. 3E, another photoresist layer 27 is then coated on the oxide layer in such a way that every part of the oxide layer except the portion 24b and its opening 25b on the bit line 22b is covered. After that, an ion implantation process is performed to implant an impurity of the second type such as P-type boron ions through the opening 25b onto the bit line 22b so as to form a lightly doped P⁻-type base region 28. The implantation is performed using an energy of 20 to 50 KeV and an ion concentration of $1 \times 10^{12}$ to $1 \times 10^{3}$ atoms/cm². Subsequently, an impurity of the first type such as N-type phosphorus ions is implanted through the opening 25b to form a heavily doped N⁺-type emitter region 29 on the P⁻-type base region 28. The implantation is performed with an energy of 30 to 60 KeV and an ion concentration of $1 \times 10^{14}$ to $1 \times 10^{6}$ atoms/cm². After that, the photoresist layer 27 is removed by using suitable solvents.

Figure 3F:
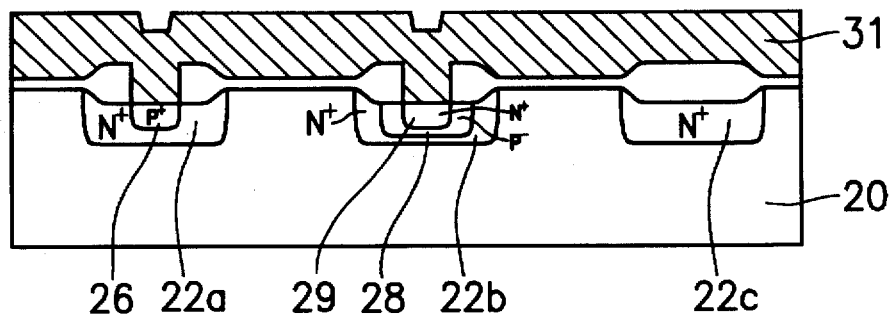

Referring finally to FIG. 3F, a metallization layer such as tungsten (W), titanium (Ti), aluminum (Al), or polysilicon is deposited by means of chemical-vapor deposition (CVD) on the silicon substrate 20. The metallization layer is then etched in a predefined pattern to form word lines 31, each of which crosses over the bit lines 22a, 22b, 22c. In the steps performed later, conventional processes are used to form contacts, metallurgy, passivation, and packaging to finish the fabrication of the multi-stage ROM device.

Since the portion of the bit line 22a where the P⁺-type region 26 is formed is an N⁺-type region, a PN diode is formed with a threshold voltage controlled at about 0.7 V; and since the bit line 22b is N⁺-type, it can serve as a collector region which in combination with the N⁺-type emitter region 29 and the P⁻-type base region 28 forms a bipolar transistor with a threshold voltage controlled at about 3 V–5 V. As to the intersection between bit line 22c and word line 31, due to the isolation by the thick oxide layer 24c, the intersection is formed in a permanent "OFF" state.

In conclusion, in the multi-stage ROM device according to the invention, various control voltages such as 0.7 V or 3 V–5 V can be applied to the word lines 31 and the selected bit line from the bit lines 22a, 22b, 22c (besides the selected one, others are floating), so as to put the memory cell at the intersection between the word line and the bit line into the desired state.

It is an important aspect of the invention that the intersections between word lines and bit lines are formed with memory cells of different characteristics, such that the packing density of the chip can be increased. The provision of memory cells having different characteristics allows the generation of multi-stage signals. Such memory cells include a diode formed at the intersection between the word line 31 and the bit line 22a and having its threshold voltage controlled at about 0.7 V; a bipolar transistor formed at the intersection between the word line 31 and the bit line 22b and having its threshold voltage controlled at about 3 V–5 V; and a permanently-OFF transistor formed at the intersection between the word line 31 and the bit line 22c. In the permanently-OFF transistor, there is no induction current generated.

These memory cells can be programmed in multiple stages according to customer specifications into various states. For instance, ternary data consisting of "0", "½", and "1" can be programmed into the memory cells. Since the diode, the bipolar transistor, and the permanently-OFF transistor each has its own unique conductive characteristic, the current in each of them varies. Therefore, the access to the memory cells can be achieved by means of the word line 31 and selection of one of the bit lines 22a, 22b, 22c and the use of sensing amplifiers (not shown) to read out the ternary data stored in the memory cells.

The use of sensing amplifiers for data readout from the memory cells is a conventional technique so that detailed description thereof will not be given herein. Besides, all the processes used in the ion implantation for diffusion or improving electronic characteristics are all conventional techniques so that detailed description thereof will also not be given herein.

Although the invention has been directed to the preferred embodiment in which $N^+$-type buried bit lines are used, it is to be understood that the scope of the invention need not be limited to the disclosed preferred embodiment. Materials, conductive characteristics, parameters, and conditions set for the processes are all subject to other modifications and are considered to be within the spirit and scope of the invention.

Therefore, the invention is intended to cover various modifications and similar arrangements within the scope defined in the following appended claims. The scope of the claims should be accorded the broadest interpretation so as to encompass all such modifications and similar arrangements.

What is claimed is:

1. A process for fabricating a multi-stage read-only memory device, comprising the steps of:

preparing a silicon substrate;

forming in the substrate a plurality of parallel disposed buried bit lines of a first conductivity type, said buried bit lines including at least a first bit line, a second bit line, and a third bit line;

forming an oxide layer on the silicon substrate, the oxide layer having a first thickness over the plurality of buried bit lines and a second thickness over intervals between each adjacent pair of the plurality of buried bit lines, the first thickness being greater than the second thickness;

forming first openings through the oxide layer on the first bit line so as to expose the first bit line and second openings through the oxide layer on the second bit line so as to expose the second bit line;

performing a first ion implantation process through the first openings on the first bit line so as to form ion regions of a second conductivity type in the first bit line;

performing a second ion implantation process through the second openings on the second bit line, so as to form base regions of the second conductivity type in first collector regions of the second bit line and then performing a third ion implantation process through the second openings so as to form emitter regions of the first conductivity type in the second bit line, thus creating bipolar transistors;

forming a plurality of parallel disposed word lines each of which crosses each of the plurality of bit lines to form a plurality of intersections, the bit lines crossing the first and second bit lines so as to cover the first and second openings, thus creating diode memory cells at the junction between the first bit line and the thick oxide layer covering the first bit line, bipolar transistor memory cells at the junction between the second bit line and the thick oxide layer covering the second bit line, and permanently-OFF transistor memory cells at the junction between the third bit line and the rest of the thick oxide layer.

2. A process as claimed in claim 1, wherein the first conductivity type is N-type and the second type is P-type.

3. A process as claimed in claim 1, wherein said step of forming the buried bit lines of the first conductivity type includes the step of implanting arsenic ions in said substrate with an energy of 50 KeV to 100 KeV and a concentration of $1 \times 10^{14}$ to $1 \times 10^6$ atoms/cm$^2$.

4. A process as claimed in claim 1, wherein in said step of performing a first ion implantation includes the step of implanting boron ions through the first openings with an energy of 30 KeV to 70 KeV and a concentration of $1 \times 10^{15}$ to $1 \times 10^{16}$ atoms/cm$^2$.

5. A process as claimed in claim 1, wherein said step of performing a second ion implantation includes the step of implanting boron ions through the second openings with an energy of 20 KeV to 50 KeV and a concentration of $1 \times 10^{12}$ to $1 \times 10^{13}$ atoms/cm$^2$ and the step of performing a third ion implantation includes the step of implanting phosphorus ions through the second openings with an energy of 30 KeV to 60 KeV and a concentration of $1 \times 10^{14}$ to $1 \times 10^{16}$ atoms/cm$^2$.

6. A process as claimed in claim 1, wherein the step of forming the oxide layer includes the steps of forming the first thickness of the oxide layer in the range of from 800Å to 1000Å and forming the second thickness in the range of from 250Å to 300Å.

7. A process as claimed in claim 1, wherein the step of forming a plurality of buried bit lines includes the step of forming the plurality of bit lines of a material selected from the group consisting of polysilicon, tungsten, titanium, and aluminum.

8. A process as claimed in claim 1, wherein the relative thickness of the oxide layer over the plurality of buried bit lines and over intervals between adjacent pairs of the plurality of buried bit lines, is controlled by doping of the bit lines during said step of forming the bit lines.

* * * * *